United States Patent [19]
Xia

[11] Patent Number: 5,809,082
[45] Date of Patent: Sep. 15, 1998

[54] VECTOR TRELLIS CODED MODULATION USING VECTOR CONVOLUTIONAL CODES FOR RELIABLE DATA TRANSMISSION

[75] Inventor: Xiang-Gen Xia, Westlake Village, Calif.

[73] Assignee: Hughes Electronics Corporation, El Segundo, Calif.

[21] Appl. No.: 673,715

[22] Filed: Jun. 21, 1996

[51] Int. Cl.$^6$ .............................. H04L 23/02; H04L 5/12
[52] U.S. Cl. ...................... 375/265; 371/43.4; 371/43.7
[58] Field of Search .................... 375/261, 265, 375/279, 295, 298, 308; 371/43.4, 43.7, 43.8

[56] References Cited

U.S. PATENT DOCUMENTS

| | | | |
|---|---|---|---|
| 4,922,507 | 5/1990 | Simon et al. | 375/26 |
| 5,023,889 | 6/1991 | Divsalar et al. | 375/265 |
| 5,321,725 | 6/1994 | Paik et al. | 375/265 |
| 5,395,518 | 3/1995 | How | 375/265 |
| 5,717,706 | 2/1998 | Ikeda | 371/43 |

OTHER PUBLICATIONS

P.P. Vaidyanathan, Multirate Digital Filters, Filter Banks, Polyphase Networks, and Applications: A Tutorial, *Proceedings of the IEEE*, vol. 78, No. 1, Jan. 1990, pp. 56–93.

R. Johannesson et al., "Further Results on Binary Convolutional Codes with an Optimum Distance Profile", *IEEE Transactions on Information Theory*, IT–24, Mar. 1978, pp. 264–268.

Shu Lin et al., "Convolutional Codes", *Error Control Coding: Fundamentals and Applications*, Chapter 10, Prentice–Hall, New Jersey, 1983, pp. 287–314.

E. Biglien et al., TCM: Combined Modulation and Coding, *Introduction to Trellis–Coded Modulation with Applications*, Chapter M, Macmillan Publishing Company, New York, 1991, pp. 67–98.

*Primary Examiner*—Chi H. Pham
*Assistant Examiner*—Bayard Emmanuel
*Attorney, Agent, or Firm*—V. D. Duraiswamy; W. K. Denson-Low

[57] ABSTRACT

A vector trellis coded modulation scheme (VTCM) is accomplished by blocking input samples into a sequence of input vectors of length L, vector convolutional coding the input vectors to map K input vectors into N output vectors and modulating the output vectors into symbols from an expanded alphabet. In a first case, each output vector is modulated to a different symbol thereby improving coding gain while maintain bandwidth efficiency. In a second case, blocks of N output vectors are modulated to one symbol thereby improving bandwidth efficiency by a factor of N while maintain coding gain. A polyphase/multirate representation of the vector convolutional codes is preferably used to generated the vector convolutional codes. In general, a computer search can be employed to find the polyphase coefficients that define the set of vector convolutional codes. When the input and output vectors have the same length, known scalar-valued convolutional codes are blocked to generate the vector convolutional codes. This provides good modulation codes without having to perform a computer search.

11 Claims, 8 Drawing Sheets

VECTOR TRELLIS CODED MODULATION USING VECTOR CONVOLUTIONAL CODES FOR RELIABLE DATA TRANSMISSION

BACKGROUND OF THE INVENTION

1. Field of the Invention

This invention relates to error protection and signal modulation for digital communication systems and more specifically to vector trellis coded modulation (VTCM) using vector convolutional codes (VCC).

2. Description of the Related Art

Reliable transmission of data over noisy channels is an important problem in digital communication systems. One solution is to increase the transmitter power, which in turn increases the signal-to-noise ratio (SNR) of the received signal. However, this solution is expensive due to the cost of higher power hardware, and is not feasible in power-limited environments such as on-board a satellite. The preferred solution is to use error correcting codes, which increase reliability by adding redundancy to the transmitted signal. Conventional error correction codes use a K/N scalar convolutional coder that adds N-K redundant bits to every K bits of information and an independent modulation scheme that maps the bit stream into waveforms that are transmitted over the noisy channels. The disadvantages of existing error correcting codes are: 1) high rate codes that add a lot of redundancy either reduce the transmitted data rate or increase the bandwidth required to maintain a given data rate, and 2) low rate codes require complex and computationally intensive decoding hardware. Trellis coded modulation (TCM) combines the convolutional coding and modulation schemes into a unique operation, which improves the reliability of the communications channel without increasing the transmitted power or the required bandwidth. However, improved power and bandwidth efficiency are still needed.

A K/N convolutional coder is a linear system with K input and N outputs, where K<N, and signals and system coefficients take values in finite fields. Without loss of generality, assume the finite field is binary so that each K bits in the input sequence is mapped into N bits in the output sequence. As a result, the encoder adds N-K redundant bits to each K bits, which are used to provide error protection. Convolutional codes differ from block codes in that the encoder contains memory and the N output bits at any given time depend not only from the K input bits at that time but also on m previous input bits. Shu Lin and D. J. Costello, "Error Control Coding: Fundamentals and Applications," chapter 10, pp. 287–314, 1983 provides a detailed analysis of convolutional codes.

A K/N convolutional coder with memory size m can be represented by a state transition diagram 10 as shown in FIG. 1. For a ⅔ convolution code with memory m=2, the state diagram has a total of $2^m=4$ states 12 and $2^k=4$ branches 14 leaving/arriving at each state 12. Each state has a different m bit label $t_m \ldots t_1 t_0$. In this case, the four states are labeled 00,01,10,11. The branches 14 represent transitions between the states and the labels $r_k \ldots r_1 r_0 / s_n \ldots s_1 s_0$ on each branch indicate the input necessary to cause that transition and generate the associated output. For example, if the convolutional coder is in state 00 and the two bit input $(r_1 r_0)$ is 01, the next state will be 01 and the output $(s_2 s_1 s_0)$ will be 011.

A trellis diagram is a state transition diagram 10 that is expanded in time, where each time unit is a separate state diagram. Specifying a path through the trellis is equivalent to specifying a sequence of states or state transitions. All of the possible paths through the trellis define all of the possible different convolutional codes.

The error correction capability of convolutional codes depends on their free distance, which is defined as the minimum Hamming distance between any two codes in the trellis. The Hamming distance is the total number of bit positions where the two sequences differ. Because convolutional codes are linear, the free distance for a convolutional code is equal to the minimum weight (the number of 1s) of all the non zero convolutional codes.

The simplest modulation scheme takes the output of the convolutional coder and transmits one of two symbols at each time interval with each symbol representing a single bit of information. The system's bandwidth efficiency, i.e. the number of bits transmitted/Hz, can be improved by increasing the number of symbols. For example, each block of $\log_2 M$ bits can be mapped to one of M symbols. This increases the information throughput by $\log_2 M$.

In a power limited system, the penalty for the increasing in the alphabet size is a reduction in intersymbol distance. This increases the symbol error rate during demodulation. The transmitted data is demodulated by choosing the symbol that is closest to the received symbol. In conventional modulation schemes, each symbol is demodulated independently. A performance measure for a modulation scheme is the minimum Euclidean distance $d^2_{min}$ between any two symbols in the symbol constellation.

In Trellis Coded Modulation (TCM), convolutional coding is combined with multisymbol modulation to provide higher throughput and lower demodulation/decoding error as described by E. Biglieri et al, "Introduction to Trellis Coded Modulation with Applications," chapter 3, pp. 67–98, 1991. The output sequence of the K/N convolutional coder is mapped into an M alphabet modulation scheme. Similar to the convolutional coder, TCM can be described by a trellis diagram, in which the output is mapped to one of the M symbols at each state transition. Therefore, the possible codes are defined by the combination of all of the possible paths through the trellis with the possible symbols at each state.

When a TCM system is implemented in hardware, the convolutional coding and multisymbol modulation schemes are combined into a finite state machine. The structure of the finite state machine is determined from the convolutional coder's state transition diagram and the modulation scheme. The design of a particular finite state machine is well known in the art once the state transition diagram is specified.

The convolutional coding portion of TCM causes the transmitted symbols to be a function of previously transmitted symbols. To exploit this dependency, demodulation is performed on an entire received symbol sequence instead of on a symbol by symbol basis. The Viterbi algorithm is used to find the maximum likelihood path through the TCM trellis to simultaneously demodulate and decode the sequence. Since demodulation is performed on the entire sequence, the distance metric for TCM is the distance between the different paths through the trellis.

A performance measure for TCM is the minimum free distance $d^2_{free}$, which is the sum of the distances between the closest two paths in the trellis. A measure of improvement between a non-TCM system and a TCM system is known as the coding gain and is defined as:

$$\gamma = \frac{d_{free}^2/E}{d_{min}^2/E'} \quad (1)$$

where E' and E are the average energies spent to transmit with uncoded and coded symbols, respectively. The coding gain compares the improvement in distance between the TCM and non TCM system (symbol sequence distance vs. individual symbol distance) normalized by the power used to transmit each symbol. The improvement in distance (measured by coding gain) results in less error in demodulation and decoding.

SUMMARY OF THE INVENTION

In view of the above problems, the present invention provides a method for encoding and modulating signals to increase transmission reliability over a noisy channel.

This is accomplished by blocking input samples into a sequence of input vectors of length L, vector convolutional coding the input vectors to map K input vectors into N output vectors and modulating the output vectors into symbols from an expanded alphabet. In a first case, each output vector is modulated to a different symbol thereby improving coding gain while maintain bandwidth efficiency. In a second case, blocks of N output vectors are modulated to one symbol thereby improving bandwidth efficiency by a factor of N while maintain bit error rate (BER) performance.

A polyphase/multirate representation of the vector convolutional codes is preferably used to generated the vector convolutional codes. In general, a computer search can be employed to find the polyphase coefficients that define the set of vector convolutional codes. When the input and output vectors have the same length, known scalar-valued convolutional codes are blocked to generate the vector convolutional codes. This provides good modulation codes without having to perform a computer search.

These and other features and advantages of the invention will be apparent to those skilled in the art from the following detailed description of preferred embodiments, taken together with the accompanying drawings, in which:

DETAILED DESCRIPTION OF THE INVENTION

The present invention utilizes a polyphase/multirate filterbank representation of convolutional codes to develop K/N vector convolutional codes (VCC) and two different vector trellis coded modulation schemes VTCM1 and VTCM2. The nonmaximally decimated polyphase/multirate filterbank representation is an equivalent representation to a convolutional coder. P. P. Vaidyanathan, "Multirate Digital Filters, Filter Banks, Polyphase Networks, and Applications: A Tutorial," Proceedings of the IEEE, Vol. 78, No. 1, pp. 56–93, January, 1990 describes the basics of polyphase/multiratefiltering, which are extended and applied herein to convolutional codes.

The VCC codes are achieved by blocking the signals into vectors, convolutional coding the vectors, and then unblocking them into individual symbols. In theory, better performance is always achievable by coding vectors instead of scalars. Furthermore, VCC provides more freedom to use different and better coding and modulation structures than does scalar convolutional codes. In VTCM1, each convolutional code is modulated to a different symbol. This increases coding gain while maintaining bandwidth efficiency. In VTCM2, each block of N convolutional codes is modulated to a symbol. This increases bandwidth efficiency by a factor of N while maintaining the reliability of the transmission channel.

A general rate K/N scalar convolutional code is defined by an N×K transfer function matrix:

$$G(z) = \begin{bmatrix} G_{0,0}(z) & \ldots & G_{0,K-1}(z) \\ \vdots & \ldots & \vdots \\ \vdots & \ldots & \vdots \\ G_{N-1,0}(z) & \ldots & G_{N-1,K-1}(z) \end{bmatrix} \quad (2)$$

where $$G_{l,j}(z) = \sum_n h_l[Kn+j], \ 0 \leq l \leq N-1, \ 0 \leq j \leq K-1 \quad (3)$$

and $h_l[n]$ is the impulse response of the $l^{th}$ filter $H_l(z)$.

Figures 1, 2:
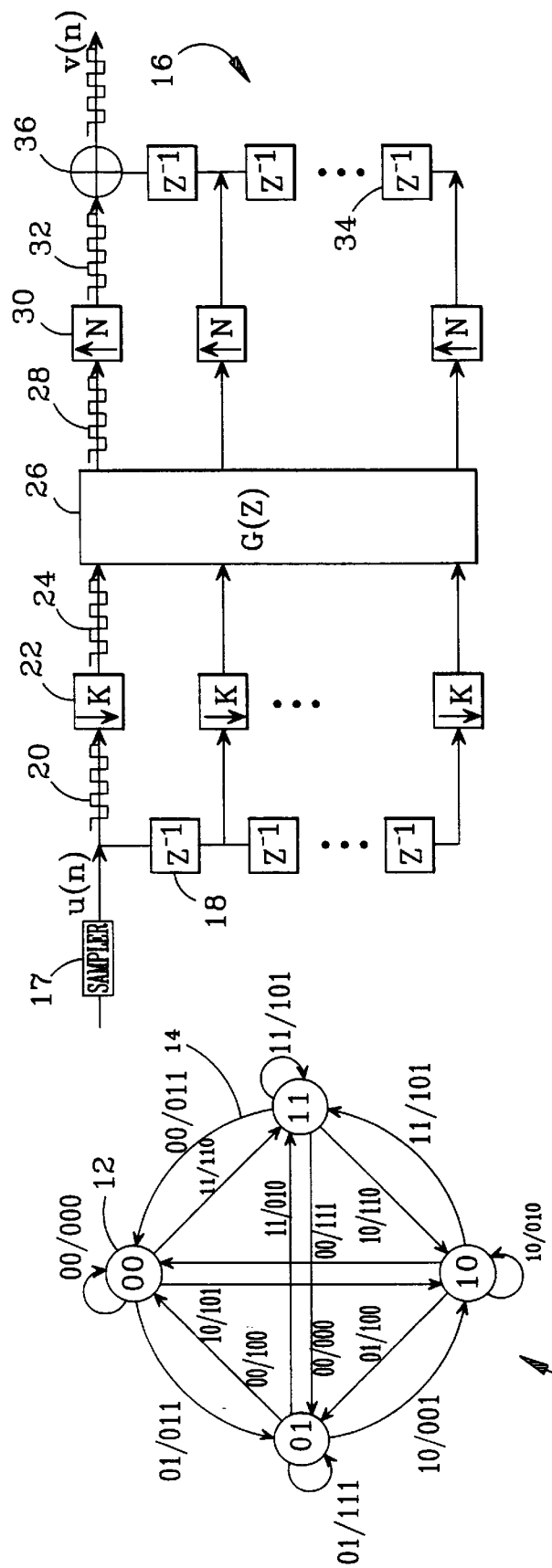
FIG. 1, described above, is a state transition diagram for a scalar convolutional coder.
FIG. 2 is a polyphase representation of a K/N scalar convolutional coder.

The transfer function matrix G(z) for a K/N convolutional code is also the polyphase matrix for a multirate analysis filterbank. The equivalent polyphase representation 16 of a K/N scalar convolutional coder is shown in FIG. 2. A sampler 17 samples an input signal to generate a sequence of input samples u[n]. The bit stream is applied to a string of K−1 delay elements 18. K delayed sequences 20 of samples u[n] are tapped off of the string so that each successive sequence 20 is delayed by an additional time interval. Decimators 22 subsample each sequence 20 by a factor K to generate subsampled sequences 24. The polyphase matrix G(z) 26 maps the K subsampled sequences 24 into N subsampled sequences 28. Expanders 30 insert N−1 zeros between every input sample u[n] in the respective subsampled sequences 28 to produce expanded sequences 32. The expanded sequences are input to respective taps in a string of N−1 delay elements 34 and summed together at junction 36 to produce a convolutionally coded output sequence, in which every K input samples u[n] are represented by N output samples v[n]. The coefficients of the polyphase matrix G(z) are selected so that the possible convolutional codes, i.e. the output sequences, are separated as much as possible. This improves the error rate performance of the received signal.

Figure 3:
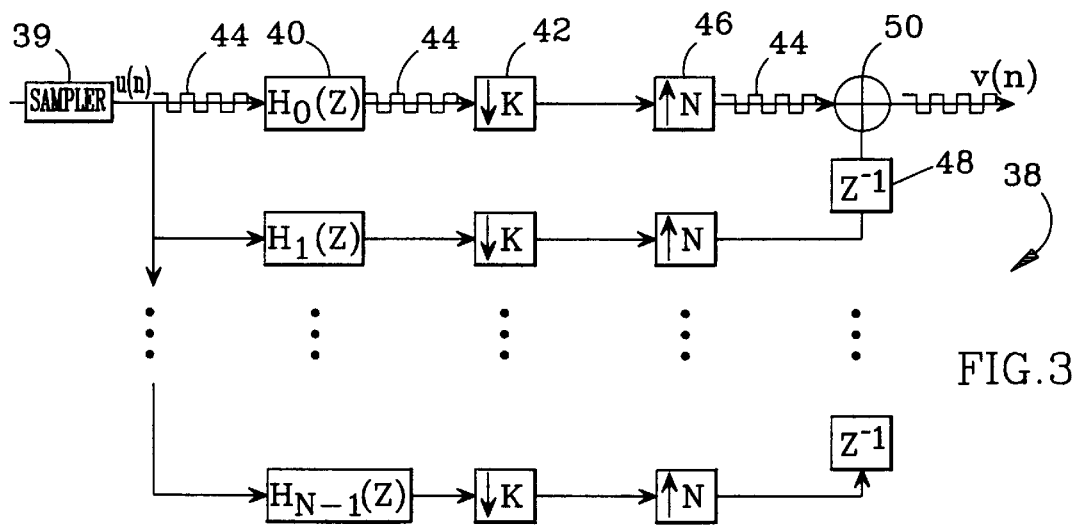
FIG. 3 is a multirate filterbank representation of a K/N scalar convolutional coder.

The multirate filterbank representation 38 shown in FIG. 3 is equivalent to the polyphase representation 16 shown in FIG. 2. The main advantage of the multirate representation is that the signal is split into several different frequency bands, each of which may be processed according to different needs. Thus, it is simpler to design the matrix coefficients that determine the structure of the convolutional code. The individual scalar-valued filter transfer functions $H_1(z)$ are computed as an expansion of the polyphase components $G_{1,k}(z)$ as follows:

$$H_1(z) = \sum_{k=0}^{K-1} z^{-k} G_{1,k}(z^k), 0 \leq 1 \leq N-1 \quad (4)$$

A sampler 39 generates a sequence of input samples u[n] that are simultaneously input to each of the N filters $H_1(z)$ 40, which together form a multirate filterbank. Decimators 42 subsample the N sequences 44 output by the respective filters by a factor K and expanders 46 insert N−1 zeros into each of the sequences. The sequences are then applied to different taps on a string of N−1 delay elements 48 and summed together at a junction 50 to produce a sequence of output samples v[n], in which every K input samples u[n] are represented by N output samples v[n]. The sequence of output samples v[n] produced by the multirate representation is equivalent to both the polyphase representation and the conventional convolutional coder.

Vector convolutional codes are generated by blocking the sequence of input samples u[n] into vectors u of length L, vector convolutional coding K vectors into N output vectors of length M using either the polyphase or multirate representations shown in FIGS. 2 and 3, respectively, generalized to process vectors instead of scalars, and then unblocking the sequence of output vectors v into a sequence of output samples v[n]. The outputs samples v[n] for the scalar and vector convolutional codes are the same for a single filter system. However, because the (un)blocking process is not commutative with decimation and expansion, the output samples v[n] for a multi-filter system are, in general, not the same. As a special case, when K=1, the blocked VCC codes are equivalent to the convolution codes. This is because decimation by 1 followed by the expansion by N does nothing more than reorganize the output sequence.

Figure 4:
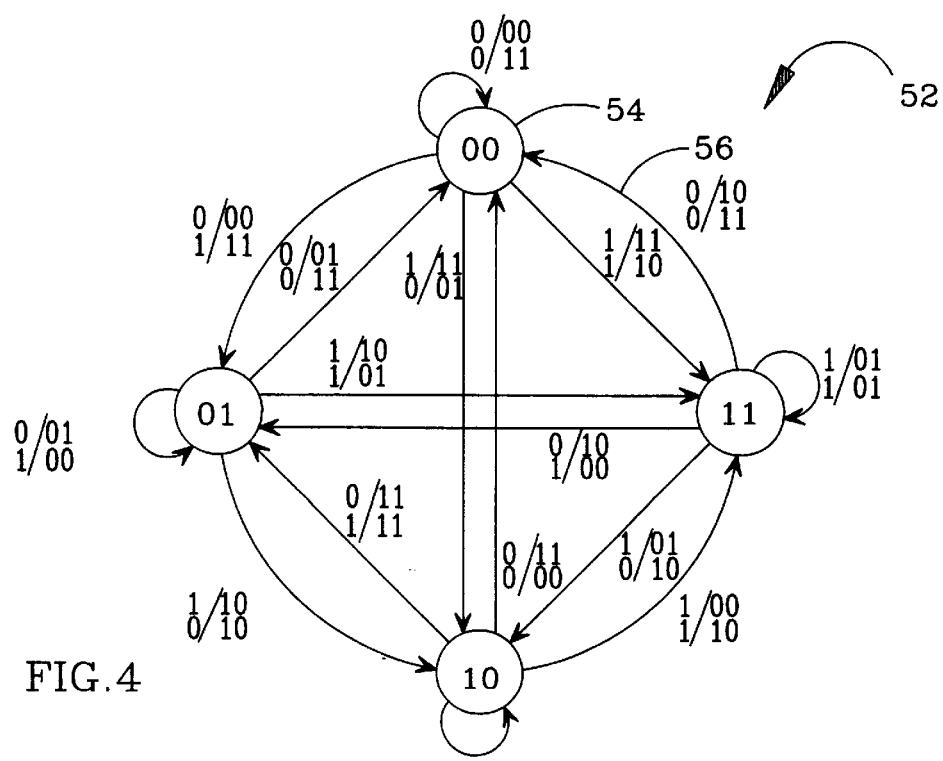
FIG. 4 is a state transition diagram for a K/N vector convolutional coder (VCC) in accordance with the present invention.

A vector state transition diagram 52 is shown in FIG. 4 for a ½ vector convolutional code having memory m=2, an input block length L=2, and an output block length M=2. The state transition diagram has a total of $2^m=4$ states 54 and $2^{km}=4$ branches 56 leaving/arriving at each state 54. VCC increases the number of branches between states, and thus increases the number of possible convolution codes from which the decoder can choose. Each state has a different m bit label $t_m \ldots t_1 t_0$. In this case, the four states are 00,01, 10,11. The branches 56 represent transitions between the states and the labels $r_{KL} \ldots r_1 r_0 / s_{NM} \ldots s_1 s_0$ on each branch indicate the input necessary to cause that transition and generate the associated output. For example, if the convolutional coder is in state 00 and the two bit vector is 01, the next state will be 01 and the output will be the vector 0011.

Figure 5:
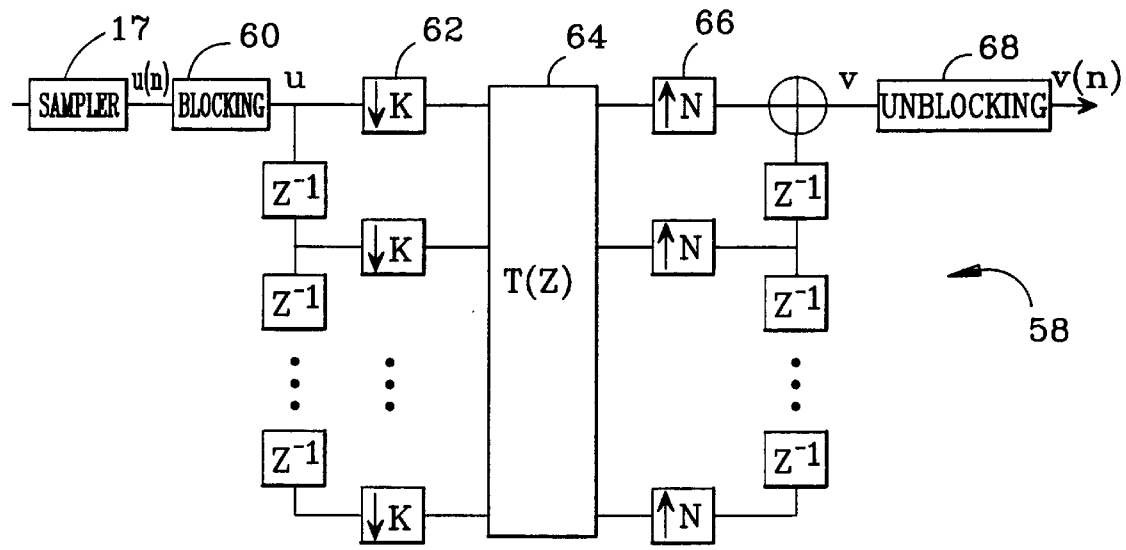
FIG. 5 is a polyphase representation of the K/N VCC shown in FIG. 4.

FIG. 5 is a vector polyphase representation 58 of the vector state transition diagram. The vector representation 58 is analogous to the scalar representation 16 shown in FIG. 2 except that the input samples u[n] are blocked 60 into vectors u of length L, the decimators 62 subsample every $k^{th}$ input vector u, the polyphase matrix T(z) 64 is an NM×KL block matrix, the expanders 66 insert N−1 zero vectors of length M between successive vectors, and the output vectors v of length M are unblocked 68 into a sequence of samples v[n].

The NM×KL block polyphase matrix T(z) is given by:

$$T(z) = \begin{bmatrix} S_{0,0}(z) & S_{0,1}(z) & \ldots & S_{0,K-1}(z) \\ . & . & \ldots & . \\ . & . & \ldots & . \\ . & . & \ldots & . \\ S_{N-1,0}(z) & S_{N-1,1}(z) & \ldots & S_{N-1,K-1}(z) \end{bmatrix} \quad (5)$$

where each submatrix $S_{1,j}(z)$ is an M×L matrix.

Figure 6:
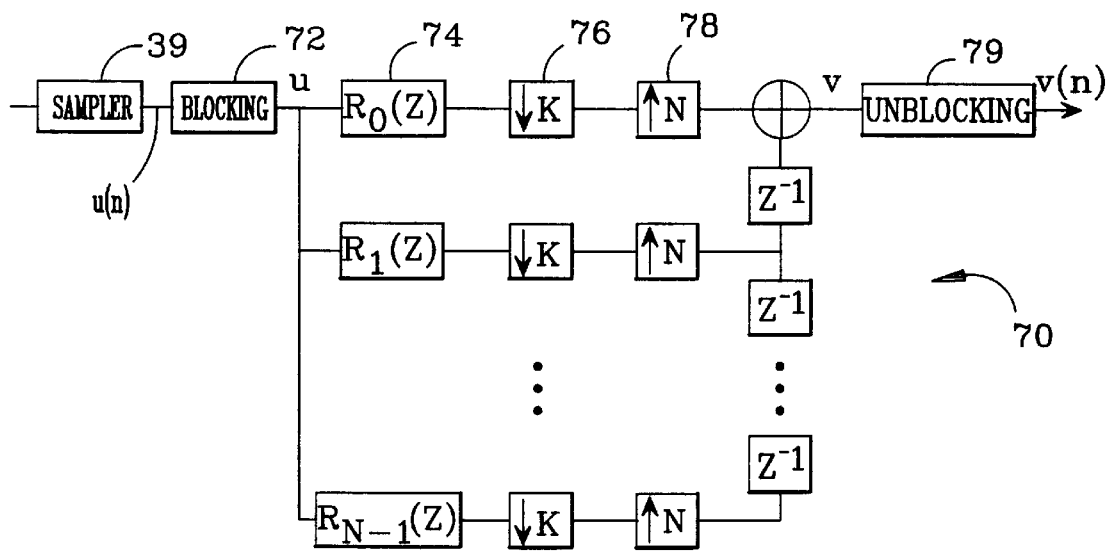
FIG. 6 is a multirate filterbank representation of the K/N VCC shown in FIG. 4.

FIG. 6 is a vector multirate filter representation 70 of the vector state transition diagram. The vector representation 70 is analogous to the scalar representation 38 shown in FIG. 3 except that the input samples u[n] are blocked 72 into vectors u of length L, the filter transfer functions $R_1(z)$ 74 are M×L matrices, the decimators 76 subsample every $k^{th}$ vector, the expanders 78 insert N−1 zero vectors of length M between successive vectors, and the output vectors v of length M are unblocked 79 into a sequence of samples v[n].

The coefficients of each submatrix in the polyphase representation and each filter transfer function in the multirate representation can be computed using a computer search that maximizes the minimum distance between code sequences. This type of computer search is well known in the field of signal coding, R. Johannesson and E. Paaske, "Further Results in Binary Convolutional Codes with an Optimum Distance Profile," IEEE Transactions on Information Theory, IT-24, pp. 264–268, March 1978. In general, a source generates test data having a distribution similar to that of the actual transmitted data. The coefficients are initialized with a random distribution and iterated until they converge to values that provide a good minimum distance. The VCC codes may have a better minimum Hamming distance than the scalar convolution codes. This would further improve the performance of VCC codes versus scalar codes.

Figure 7:
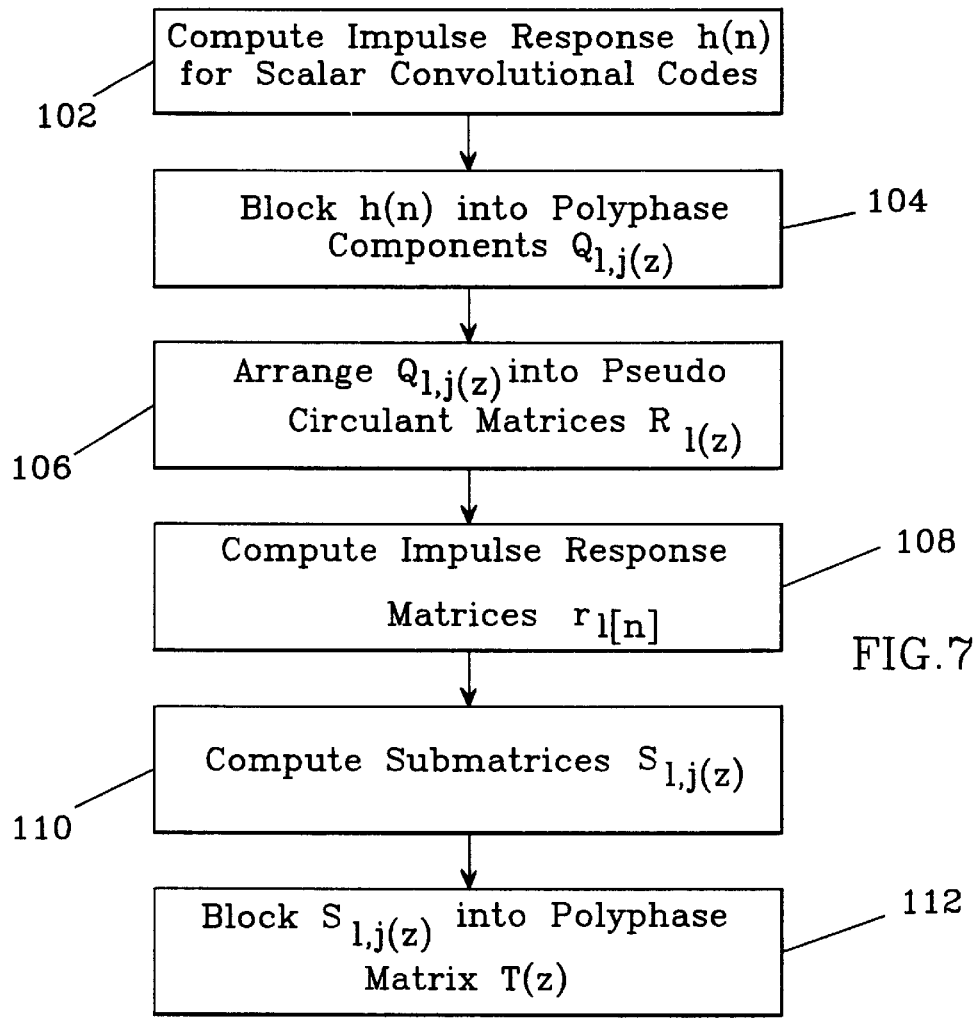
FIG. 7 is a flowchart illustrating the computation of the blocked M×M pseudo-circulant filter response functions and the blocked polyphase matrix for the case L=M.

In a special, but very important case, where the length of the input and output vectors is the same, i.e. L=M, the coefficients can be generated by blocking known K/N scalar-valued convolutional codes as shown in FIG. 7. As a result, VCC codes can realize either improved bandwidth efficiency or coding gain without having to compute, e.g. search for, optimum coefficients. The impulse response coefficients $h_1[n]$ are proveded (step 102) for each scalar-valued filter transfer function $H_1(z)$ and blocked (step 104) into polyphase components $Q_{1,j}(z)$ as follows:

$$Q_{1,j}(z) = \sum_n h_1[nM+j]z^{-n}, 0 \leq 1 \leq N-1, 0 \leq j \leq M-1 \quad (6)$$

The polyphase components $Q_{1,j}(z)$ are arranged (step 106) into M×M pseudo-circulant matrices $R_1(z)$ for use in FIG. 6 where $$R_l(z) = \begin{bmatrix} Q_{l,0}(z) & z^{-1}Q_{l,M-1}(z) & \cdots & z^{-1}Q_{l,1}(z) \\ Q_{l,1}(z) & Q_{l,0}(z) & \cdots & z^{-1}Q_{l,2}(z) \\ \vdots & \vdots & \cdots & \vdots \\ \vdots & \vdots & \cdots & \vdots \\ Q_{l,M-2}(z) & Q_{l,M-3}(z) & \cdots & z^{-1}Q_{l,M-1}(z) \\ Q_{l,M-1}(z) & Q_{l,M-2}(z) & \cdots & Q_{l,0}(z) \end{bmatrix} \quad (7)$$

for l=0,1, . . . , N−1.

The polyphase matrix T(z) for use in FIG. 5 is generated by first computing the impulse response matrices $r_l[n]$ (step 108) for each of the pseudo-circulant matrices $R_l(z)$:

$$R_l(z) = \sum_n r_l[n] z^{-n} \quad (8)$$

The M×M submatrices $S_{1,j}(z)$ for the NM×KM polyphase matrix T(z) are computed (step 110) as follows:

$$S_{1,j}(z) = \sum_n r_l[Kn+j]z^{-n}, 0 \leq 1 \leq N-1, 0 \leq j \leq K-1 \quad (9)$$

The submatrices $S_{1,j}(z)$ are then blocked (step 112) to form the NM×KM polyphase matrix T(z) shown in equation 5.

Vector TCM is accomplished by modulating the output vectors v produced by the VCCs; either the vector state transition diagram, the polyphase representation or the multirate representation. VTCM can also be described by a trellis diagram, in which the output vector(s) is mapped to one of the symbols at each state transition. Therefore, the sequence of modulated output vectors is one of the modulation codes defined by the combination of all of the possible paths through the trellis and the possible symbols at each state.

Figure 8:
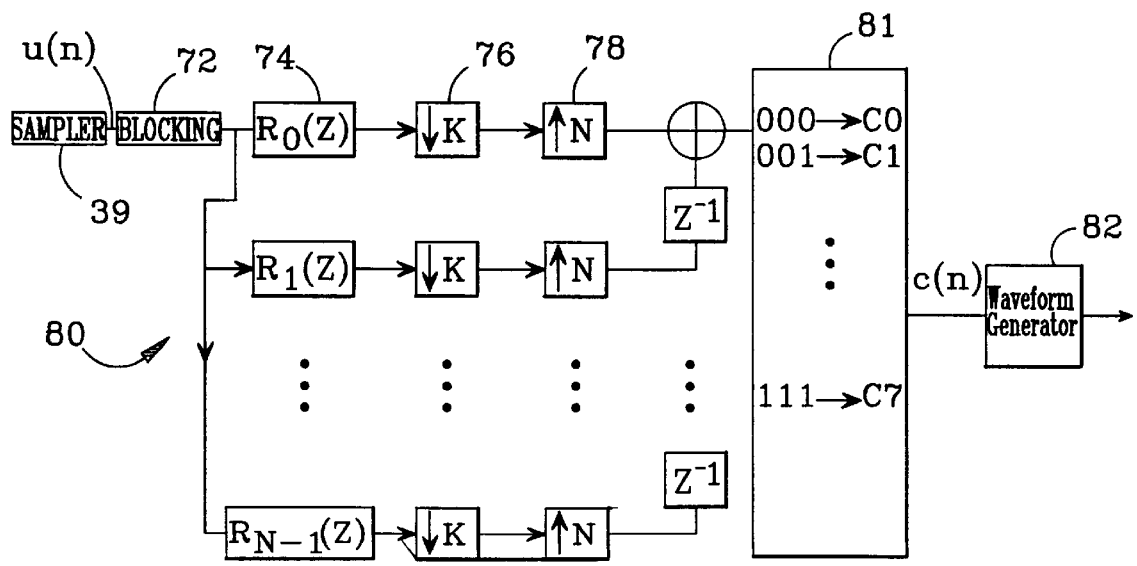
FIG. 8 is a multirate filterbank representation of a first vector trellis coded modulation (VTCM1) system that maps each convolutional code vector to a different symbol to increase coding gain while maintaining bandwidth efficiency.

In a first system 80 (VTCM1), shown in FIG. 8, a modulator 81 maps each output vector v produced by the multirate system 70 shown in FIG. 6 to a symbol $c_n$ in a constellation containing $2^M$ symbols and outputs successive symbols to form a sequence c[n]. Because each vector is mapped to a symbol, the vectors do not have to be unblocked. A waveform generator 82 generates a different waveform for each symbol and transmits it over the noisy channel to a receiver. VTCM1 increases coding gain by increasing the number of components in the paths when calculating the free distance while maintaining the same bandwidth efficiency as scalar TCM.

Figure 9:
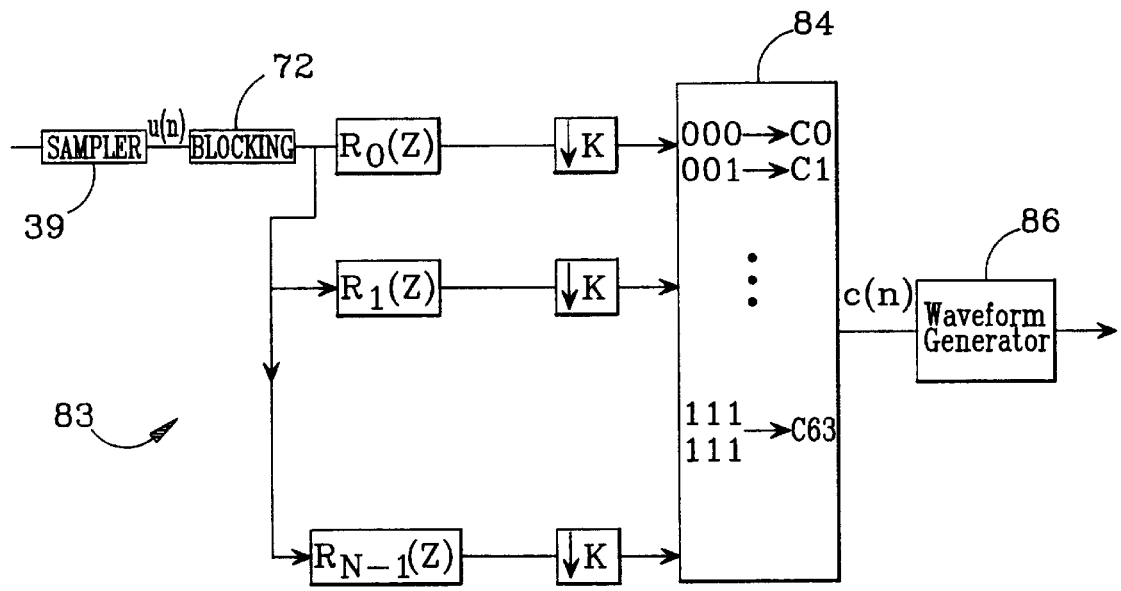
FIG. 9 is a multirate filterbank representation of a second vector trellis coded modulation (VTCM2) system that maps N convolutional code vectors to one symbol to increase bandwidth efficiency by a factor N while maintaining performance.

In a second system 83 (VTCM2), shown in FIG. 9, a modulator 84 maps each block of N output vectors v produced by the multirate system 70 shown in FIG. 6 to a symbol $c_n$ in a constellation containing $2^{MN}$ symbols and outputs successive symbols to form a sequence c[n]. Because blocks of N output vectors are mapped to a symbol, the vectors do not have to be expanded or unblocked. A waveform generator 86 generates a different waveform for each symbol and transmits it over the noisy channel to a receiver. VTCM1 increases bandwidth efficiency by a factor of N while maintaining comparable coding gain.

A receiver uses the well known Viterbi algorithm to select the optimum path through the trellis and the best symbol at each state to select the modulation code that most closely matches the received sequence of symbols. In general, VTCM is going to have a larger minimum free distance between the modulation codes then is scalar TCM. It follows that VTCM will have better error rate performance provided good vector modulation codes are found.

We present the results of VTCM1 (FIGS. 10–12) and VTCM2 (FIGS. 13–14) modulation schemes versus comparable scalar TCM schemes to illustrate the performance advantages of VTCM in coding gain and bandwidth efficiency, respectively.

Figure 10:
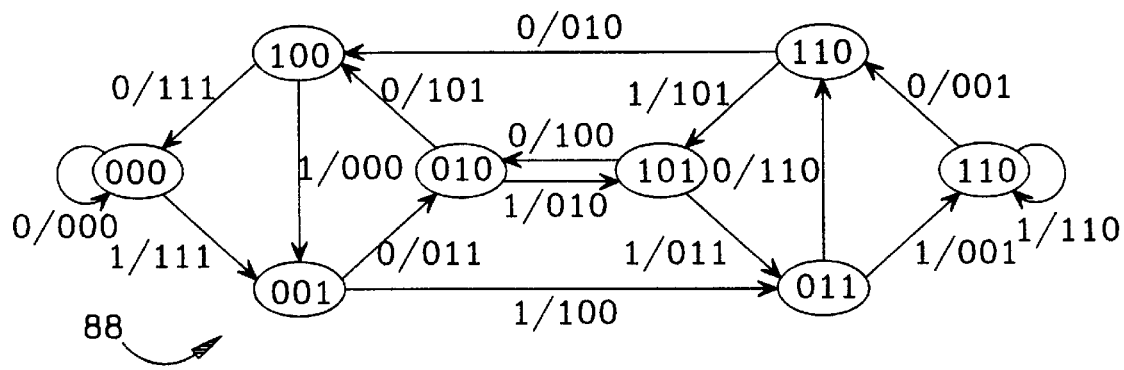
FIG. 10 is a state transition diagram for a ⅓ scalar convolutional code.

For the VTCM1 comparison, FIG. 10 is a scalar state transition diagram 88 for a rate ⅓ convolutional code with memory size m=3. The scalar TCM system uses an 8-PSK modulation scheme that maps 3 output bits to one of eight symbols $c_n$. The free distance of the scalar TCM code is:

$$d^2_{free-TCM} = d^2(111,000) + d^2(011,000) + d^2(101,000) + d^2(111,000) \quad (10)$$

$$d^2_{free-TCM} = 2d^2(c_7,c_0) + d^2(c_3,c_0) + d^2(c_5,c_0) = 8 \quad (11)$$

For reference, we use BPSK modulation for uncoded sequences so that the throughputs for both the coded and uncoded sequences is 1 bit/s/Hz. For BPSK, the minimum distance is $d^2_{min}=4$. The average energy for both TCM and BPSK systems are the same. Thus, using equation 1 the coding gain is:

$$\gamma_{TCM} = \frac{8}{4} = 3 \text{ dB}. \quad (12)$$

Figure 11:
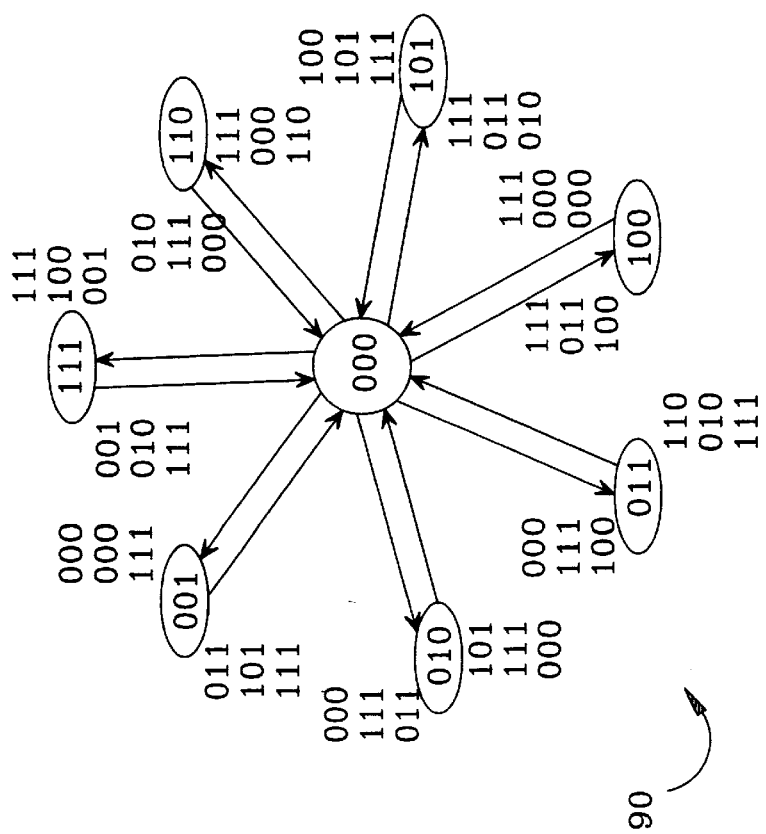
FIG. 11 is a state transition diagram for a ⅓ vector convolutional code.

FIG. 11 is a portion of a vector state transition diagram 90 for a rate ⅓ convolutional code with memory size m=3 and vector length M=3. The number of branches entering/leaving each state is $2^3=8$, which is substantially more than the number entering/leaving each state $2^1=2$ in the scalar diagram. This provides a more flexible structure, which in turn improves the performance of the modulation codes.

Figure 12:
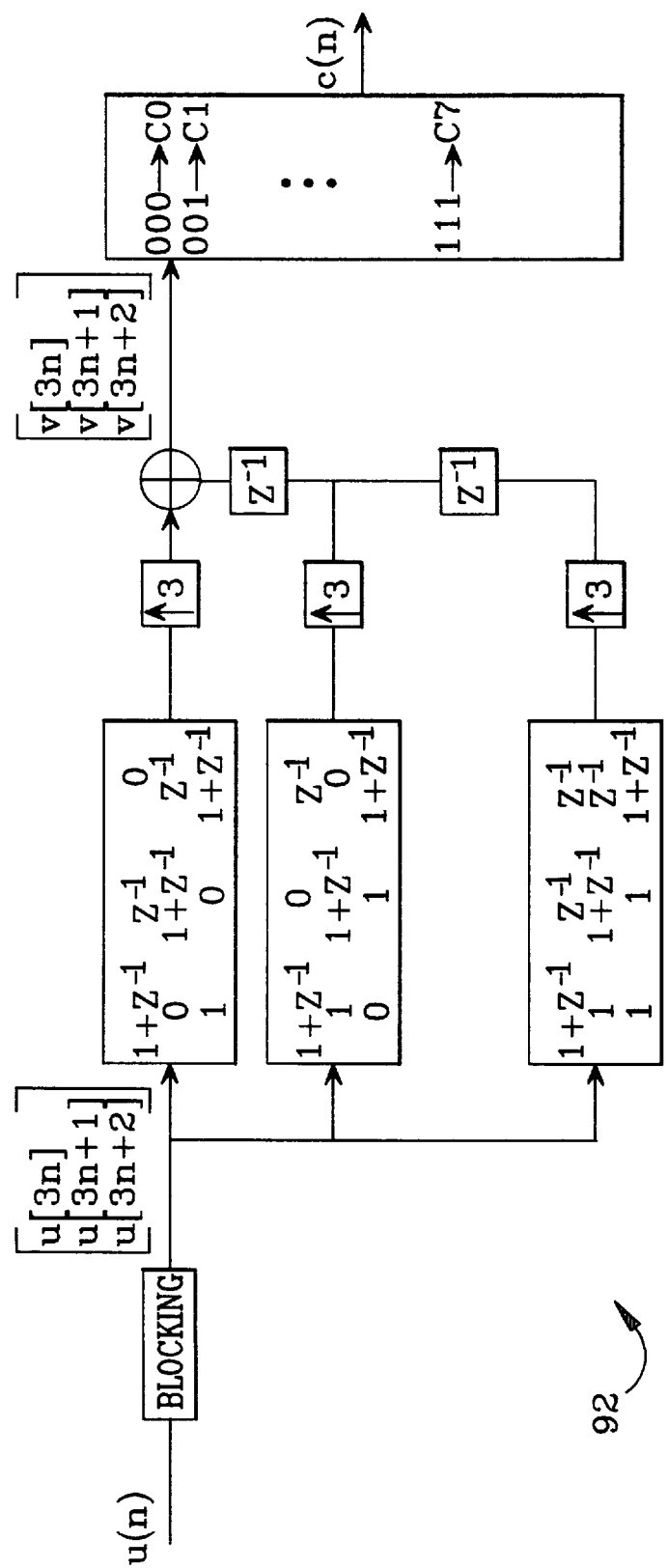
FIG. 12 is a multirate filterbank VTCM1 representation of the ⅓ VCC shown in FIG. 11.

The VTCM1 system 92 shown in FIG. 12 that implements the vector state transition diagram 90 also uses an 8-PSK modulation scheme to modulate each vector. The free distance for the VTCM1 scheme is:

$$d^2_{free-VTCM1} = d^2 \begin{pmatrix} 011\ 000 \\ 101,000 \\ 111\ 000 \end{pmatrix} + d^2 \begin{pmatrix} 000\ 000 \\ 000,000 \\ 111\ 000 \end{pmatrix} \quad (13)$$

$$d^2_{free-VTCM1} = d^2(c_3c_5c_7, c_0c_0c_0) + d^2(c_1c_1c_1, c_0c_0c_0) = 12 - \sqrt{2} \quad (14)$$

The VTCM1 coding gain is:

$$\gamma_{VTCM1} = \frac{12 - \sqrt{2}}{4} = 4.23 \text{ dB}. \quad (15)$$

Thus, the coding gain for the VTCM1 scheme is 1.23 dB better than the known scalar TCM scheme. As a result, the VTCM1 scheme will have better error rate performance at the same throughput (bandwidth).

Figure 13:
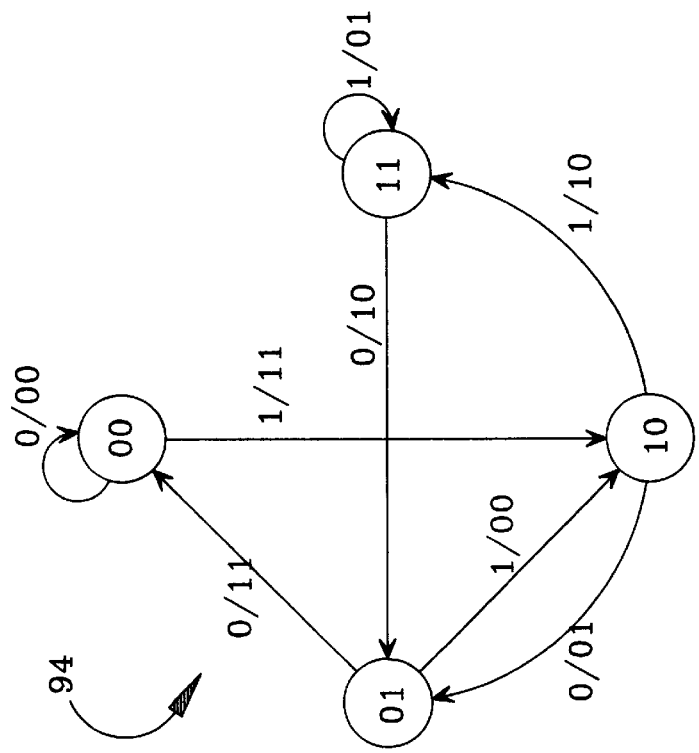
FIG. 13 is a state transition diagram for a ½ scalar convolutional code.
Figure 14:
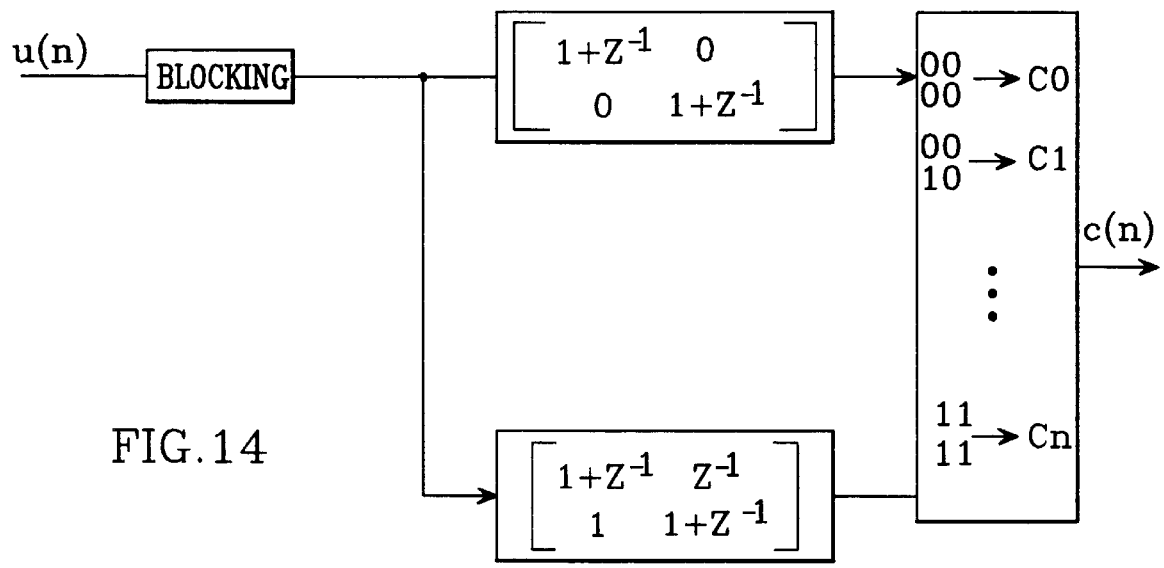
FIG. 14 is a multirate filterbank VTCM2 representation of the ½ VCC shown in FIG. 13.

For the VTCM2 comparison, FIG. 13 is a scalar state transition diagram 94 for a rate ½ convolutional code with memory size m=2. The scalar TCM system uses an 4-QPSK modulation scheme that maps 2 output bits to one of four symbols $c_n$. The free distance of the scalar TCM code is:

$$\begin{aligned} d^2_{free-TCM} &= d^2(11,00) + d^2(01,00) + d^2(11,00) \\ &= d^2(1,-1) + d^2(j,1) + d^2(1,-1) = 10. \end{aligned} \quad (16)$$

The vector state transition diagram 52 shown in FIG. 4 is a rate ½ vector convolutional code with memory size m=2 and vector length M=2. The number of branches entering/leaving each state is $2^{MN}=8$. The VTCM1 system 98 shown in FIG. 14 implements the vector state transition diagram 52 using a 16-QAM modulation scheme to modulate each vector. The free distance for the VTCM2 scheme is:

$$d^2_{free-VTCM2} = d^2\begin{pmatrix} 00 & 00 \\ 11, & 00 \end{pmatrix} + d^2\begin{pmatrix} 01 & 00 \\ 11, & 00 \end{pmatrix} \quad (17)$$

$$= d^2(0011,0000) + d^2(0111,0000) = \frac{24}{9}$$

Because VTCM2 uses a symbol constellation with four times as many symbols as does scalar TCM, the free distance for VTCM2 is much smaller than the free distance for scalar TCM. However, the bit error rate (BER) performance of VTCM2 is comparable to scalar TCM. This is attributable to the vector structure of the modulation codes.

In particular the BER of a trellis code can be upper is bounded by:

$$P_b \leq \frac{1}{C} \, erfc\left(\sqrt{\frac{d^2_{free}E_s}{2N_0}}\right) \times \exp\left(\frac{d^2_{free}E_s}{4N_0}\right) \times \frac{\partial T(D,I)}{\partial I} \quad (18)$$

where $$erfc(x) = \frac{2}{\sqrt{\pi}} \int_x^\infty e^{-t^2} dt, \, D = \exp(-E_s/(4N_0)),$$

I=1, T(D,I) is the transfer function of the state transition diagram of the trellis code, C is the number of processing information bits, and $E_s$ is the energy per trellis code symbol. In this example, for scalar TCM, C=2 and $E_s=E_b$, energy per bit, and for VTCM2, C=2 and $E_s=2E_b$. The transfer functions T(D,I) for the scalar and vector state diagrams are given by:

$$T_{TCM}(D,I) = \frac{D^5I(I - DI)}{1 - 2DI + D^2I^2 - D^3I} \quad (19)$$

and $$T_{VTCM2}(D,I) = \frac{D^5I(2 + D^5I - 4D^3I^3 - 2D^7I^3)}{1 - 2DI - D^6I^2 - 2D^8I^4 + D^8I^8} \quad (20)$$

Figure 15:
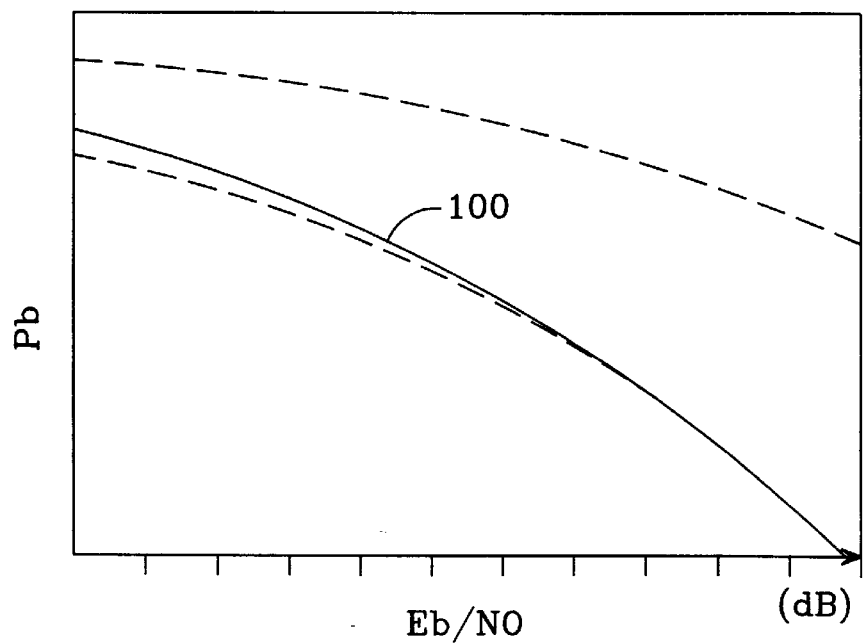
FIG. 15 is a plot of the bit error rate for scalar TCM and VTCM2.

The BER curves 100 for uncoded signals, the known scalar TCM and VTCM2 are shown in FIG. 15. The BER performance for VTCM2 is as good as the performance for scalar TCM but at N times the throughput (1/N of the bandwidth) of the scalar TCM.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

I claim:

1. A method for encoding data, comprising:

sampling an input signal to generate a sequence of input samples u[n];

blocking the input samples u[n] into a sequence of input vectors $\bar{u}$ of length L, where L is an integer;

vector trellis coded modulating the sequence of input vectors such that K input vectors are mapped into N output vectors $\bar{v}$ of length M in an outlet sequence, which are then modulated into symbols in a symbol constellation, where M is an integer; and generating a waveform in response to each of the symbols, wherein the sequence of input vectors is vector trellis coded modulated by:

vector convolutional coding the sequence of input vectors to map the K input vectors into the N output vectors $\bar{v}$; and modulating the output vectors $\bar{v}$ to said symbols, and wherein vector convolutional coding comprises:

defining a transition diagram that includes:

$2^m$ states $S_n, S_1 \ldots S_2{}^m_{-1}$ where m is a coding memory, $2^{kM}$ branches leaving and arriving at each state, said branches designating transitions between said states, and a pair of input and output labels for each branch that specify the K input vectors that cause the transition between states and the N output vectors that result from the transition, said pairs of input and output labels together determining a plurality of K/N vector convolutional codes that can be generated by the transition diagram for a given block length of input vectors; and from an initial one of said states, a) reading K input vectors from said sequence;

b) transitioning to the state in the transition diagram indicated by the K input vectors, c) outputting the N output vectors associated with that transition, and d) repeating steps a, b, and c up to the given block length such that the N output vectors together generate one of said K/N vector convolution codes, where said K/N vector convolutional codes are defined by N M×L matrix-valued filter transfer functions $R_0(z)$, $R_1(z), \ldots R_{N-1}(z)$, and wherein the input and output vectors have the same length M, said N M×M matrix-valued filter transfer functions $R_0(z), R_1(z), \ldots R_{N-1}(z)$ being generated by:

providing scalar-valued filter transfer functions $H_0(z)$, $H_1(z), \ldots H_{N-1}(z)$ for a K/N scalar convolutional code;

computing impulse responses $h_0(z), h_1(z), \ldots h_{N-1}(z)$ for the scalar-valued filter transfer functions;

computing polyphase components $Q_{ij}$ for $0 \leq i \leq N-1$, $0 \leq j \leq M-1$ from the impulse responses; and arranging the M polyphase components $Q_{ij}$ for each matrix-valued filter transfer function into a pseudo-circulant matrix.

2. A method for encoding data, comprising:

sampling an input signal to generate a sequence of input samples u[n];

blocking the input samples u[n] into a sequence of input vectors $\bar{u}$ of length L, where L is an integer;

vector trellis coded modulating the sequence of input vectors such that K input vectors are mapped into N output vectors $\bar{v}$ of length M in an output sequence, which are then modulated into symbols in a symbol constellation, where M is an integer; and generating a waveform in response to each of the symbols, wherein the sequence of input vectors is vector trellis coded modulated by:

vector convolutional coding the sequence of input vectors to map the K input vectors into the N output vectors $\bar{v}$; and modulating the output vectors $\bar{v}$ to said symbols, and wherein vector convolutional coding comprises:

multiplying each successive input vector by N M×L matrix-valued filter transfer functions $R_0(z)$, $R_1(z), \ldots R_{N-1}(Z)$ to generate N sequences of filtered vectors of length M, said filter transfer functions together forming a multirate filterbank that defines a plurality of vector convolutional codes;

decimating the sequence by a factor K to generate respective subsampled sequences that include every $K^{th}$ filtered vector;

expanding the subsample sequences by a factor N to insert N−1 length M zero vectors between successive filtered vectors and generate respective expanded sequences $S_n$ for n=0,1, . . . N−1;

delaying the expanded sequences $S_n$ where n=0,1, . . . N−1 by nM samples; and summing the expanded sequences together to generate the output sequence as one of the vector convolutional codes.

3. The method of claim 2, wherein the input and output vectors have the same length M, said N M×M matrix-valued filter transfer functions $R_0(z)$, $R_1(z)$ . . . $R_{N-1}(z)$ being generated by:

providing scalar-valued filter transfer functions $H_0(z)$, $H_1(z)$, . . . $H_{N-1}(z)$ for a K/N scalar convolutional code;

computing impulse responses $h_0(z)$, $h_1(z)$, . . . $h_{N-1}(z)$ for the scalar-valued filter transfer functions;

computing polyphase components $Q_{ij}$ for $0 \leq i \leq N-1$, $0 \leq j \leq M-1$ from the impulse responses; and arranging the M polyphase components $Q_{ij}$ for each matrix-valued filter transfer function into a pseudo-circulant matrix.

4. A method for encoding data, comprising:

sampling an input signal to generate a sequence of input samples u[n];

blocking the input samples u[n] into a sequence of input vectors $\bar{u}$ of length L, where L is an integer;

vector trellis coded modulating the sequence of input vectors such that K input vectors are mapped into N output vectors $\bar{v}$ of length M, in an output sequence, which are then modulated into symbols in a symbol constellation, where M is an integer; and generating a waveform in response to each of the symbols, wherein the sequence of input vectors is vector trellis coded modulated by:

vector convolutional coding the sequence of input vectors to map the K input vectors into the N output vectors $\bar{v}$; and modulating the output vectors $\bar{v}$ to said symbols, wherein vector convolutional coding comprises:

generating N delayed sequences by delaying the sequence of input vectors by nL samples where n=0,1, . . . N−1;

decimating the delayed sequences by a factor K to generate respective subsampled sequences that include every $K^{th}$ input vector from the corresponding delayed sequence;

multiplying the input vectors from the K subsampled sequences by an NM×KL polyphase matrix T(z) to generate N sequences of filtered vectors of length M, said polyphase matrix defining a plurality of vector convolutional codes;

expanding the sequences of filtered vectors by a factor N to insert N−1 length M zero vectors between successive filtered vectors and generate respective expanded sequences $S_n$ for n=0,1, . . . N−1;

delaying the expanded sequences $S_n$ where n=0,1 . . . N−1 by nM samples; and summing the expanded sequences together to generate the output sequence as one of the vector convolutional codes.

5. The method of claim 4, wherein the input and output vectors have the same length M, said NM×KM polyphase matrix being generated by:

providing scalar-valued filter transfer functions $H_0(z)$, $H_1(z)$, . . . $H_{N-1}(z)$ for a K/N scalar convolutional code;

computing impulse responses $h_0(z)$, $h_1(z)$, . . . $h_{N-1}(z)$ for the scalar-valued filter transfer functions;

computing polyphase components $Q_{ij}$ for $0 \leq i \leq N-1$, $0 \leq j \leq M-1$ from the impulse responses;

arranging the M polyphase components $Q_{ij}$ for each matrix-valued filter transfer function into a pseudo-circulant matrix $R_1(z)$;

computing M×M impulse responses $r_1[n]$ for the respective pseudo-circulant matrices $R_1(z)$;

computing M×M submatrices S(z) from the impulse responses $r_1[n]$; and blocking the submatrices S(z) to form said NM×KM polyphase matrix T(z).

6. A method for encoding data, comprising:

generating N scalar-valued filter transfer functions $H_0(z)$, $H_1(z)$, . . . $H_{N-1}(z)$ for a K/N scalar convolutional code;

blocking the scalar-valued filter transfer functions $H_0(z)$, $H_1(z)$, . . . $H_{N-1}(z)$ into M×M pseudo-circulant matrices to provide vector-valued transfer functions $R_0(z)$, $R_1(z)$ . . . $R_{N-1}(z)$, respectively, which define a plurality of vector convolutional codes;

sampling an input signal to generate a sequence of input samples u[n];

blocking the input samples u[n] into a sequence of input vectors $\bar{u}$ of length M;

vector convolutional coding the sequence of input vectors in accordance with the vector-valued transfer functions to map the K input vectors into the N output vectors $\bar{v}$ of length M in an output sequence;

modulating the N output vectors $\bar{v}$ into symbols in a symbol constellation; and generating a waveform in response to each of the symbols, wherein the scalar-valued filter transfer functions are blocked into the pseudo-circulant matrices by:

computing impulse responses $h_0(z)$, $h_1(z)$, . . . $h_{N-1}(z)$ for the scalar-valued filter transfer functions;

computing polyphase components $Q_{ij}$ for $0 \leq i \leq N-1$, $0 \leq j \leq M-1$ from the impulse responses; and arranging the M polyphase components $Q_{ij}$ for each matrix-valued filter transfer function into the pseudo-circulant matrix $R_1(z)$.

7. A method for encoding data, comprising:

generating N scalar-valued filter transfer functions $H_0(z)$, $H_1(z)$, . . . $H_{N-1}(z)$ for a K/N scalar convolutional code;

blocking the scalar-valued filter transfer functions $H_0(z)$, $H_1(z)$, . . . $H_{n-1}(z)$ into M×M pseudo-circulant matrices to provide vector-valued transfer functions $R_0(z)$, $R_1(z)$, . . . $R_{N-1}(z)$, respectively, which define a plurality of vector convolutional codes;

sampling an input signal to generate a sequence of input samples u[n];

blocking the input samples u[n] into a sequence of input vectors $\bar{u}$ of length M;

vector convolutional coding the sequence of input vectors in accordance with the vector-valued transfer functions to map the K input vectors into the N output vectors $\bar{v}$ of length M in an output sequence;

modulating the N output vectors $\bar{v}$ into symbols in a symbol constellation; and generating a waveform in response to each of the symbols, wherein vector convolutional coding comprises:

multiplying each successive input vector by the N matrix-valued filter transfer functions $R_0(z)$, $R_1(z), \ldots R_{N-1}(z)$ to generate N sequences of filtered vectors of length M;

decimating the sequence by a factor K to generate respective subsampled sequences that include every $K^{th}$ filtered vector;

expanding the subsample sequences by a factor N to insert N−1 length M zero vectors between successive filtered vectors and generate respective expanded sequences $S_n$ for n=0,1, . . . N−1;

delaying the expanded sequences $S_n$ where n=0,1, . . . N−1 by nM samples; and summing the expanded sequences together to generate the output sequence as one of the vector convolutional codes.

8. A method for encoding data, comprising:

generating N scalar-valued filter transfer functions $H_0(z)$, $H_1(z), \ldots H_{N-1}(z)$ for a K/N scalar convolutional code;

blocking the scalar-valued filter transfer functions $H_0(z)$, $H_1(z), \ldots H_{N-1}(z)$ into M×M pseudo-circulant matrices to provide vector-valued transfer functions $R_0(z)$, $R_1(z), \ldots R_{N-1}(z)$, respectively, which define a plurality of vector convolutional codes;

sampling an input signal to generate a sequence of input samples u[n];

blocking the input samples u[n] into a sequence of input vectors $\bar{u}$ of length M;

vector convolutional coding the sequence of input vectors in accordance with the vector-valued transfer functions to map the K input vectors into the N output vectors $\bar{v}$ of length M in an output sequence;

modulating the N output vectors $\bar{v}$ into symbols in a symbol constellation; and generating a waveform in response to each of the symbols, wherein vector convolutional coding comprises:

generating N delayed sequences by delaying the sequence of input vectors by nL samples where n=0,1, . . . N−1;

decimating the delayed sequences by a factor K to generate respective subsampled sequences that include every $K^{th}$ input vector from the corresponding delayed sequence;

multiplying the input vectors from the K subsampled sequences by an NM×KL polyphase matrix T(z) to generate N sequences of filtered vectors of length M, said polyphase matrix being constructed by blocking the matrix-valued filter transfer functions;

expanding the sequences of filtered vectors by a factor N to insert N−1 length M zero vectors between successive filtered vectors and generate respective expanded sequences $S_n$ for n=0,1, . . . N−1;

delaying the expanded sequences $S_n$ where n=0,1, . . . N−1 by nM samples; and summing the expanded sequences together to generate the output sequence as one of the vector convolutional codes.

9. A method for generating vector convolutional codes, comprising:

sampling an input signal to generate a sequence of input samples u[n];

blocking the input samples u[n] into a sequence of input vectors $\bar{u}$ of length L;

vector convolutional coding the sequence of input vectors to map the K input vectors into the N output vectors $\bar{v}$ of length M in an output sequence; and unblocking each successive output vector $\bar{v}$ in the output sequence to produce a sequence of output samples v[n] in which K input samples u[n] are represented by N output samples v[n], wherein vector convolutional coding comprises:

generating N scalar-valued filter transfer functions $H_0(z)$, $H_1(z), \ldots H_{N-1}(z)$ for a K/N scalar convolutional code;

blocking the scalar-valued filter transfer functions $H_0(z)$, $H_1(z), \ldots H_{N-1}(z)$ into M×M pseudo-circulant matrices to provide vector-valued transfer functions $R_0(z)$, $R_1(z), \ldots R_{N-1}(z)$, respectively, which define a plurality of vector convolutional codes;

multiplying each successive input vector by the N matrix-valued filter transfer functions $R_0(z)$, $R_1(z), \ldots R_{N-1}(z)$ to generate N sequences of filtered vectors of length M;

decimating the sequence by a factor K to generate respective subsampled sequences that include every $K^{th}$ filtered vector;

expanding the subsample sequences by a factor N to insert N−1 length M zero vectors between successive filtered vectors and generate respective expanded sequences $S_n$ for n=0,1, . . . N−1;

delaying the expanded sequences $S_n$ where n=0,1, . . . N−1 by nM samples; and summing the expanded sequences together to generate the output sequence as one of the vector convolutional codes.

10. The method of claim 9, wherein the scalar-valued filter transfer functions are blocked into the pseudo-circulant matrices by:

computing impulse responses $h_0(z), h_1(z), \ldots h_{N-1}(z)$ for the scalar-valued filter transfer functions;

computing polyphase components $Q_{ij}$ for $0 \leq i \leq N-1$, $0 \leq j \leq M-1$ from the impulse responses; and arranging the M polyphase components $Q_{ij}$ for each matrix-valued filter transfer function into the pseudo-circulant matrix.

11. A method for generating vector convolutional codes, comprising:

sampling an input signal to generate a sequence of input samples u[n];

blocking the input samples u[n] into a sequence of input vectors $\bar{u}$ of length L;

vector convolutional coding the sequence of input vectors to map the K input vectors into the N output vectors $\bar{v}$ of length M in an output sequence; and unblocking each successive output vector $\bar{v}$ in the output sequence to produce a sequence of output samples v[n] in which K input samples u[n] are represented by N output samples v[n], wherein vector convolutional coding comprises:

generating N scalar-valued filter transfer functions $H_0(z)$, $H_1(z), \ldots H_{N-1}(z)$ for a K/N scalar convolutional code;

blocking the scalar-valued filter transfer functions $H_0(z)$, $H_1(z), \ldots H_{N-1}(z)$ into M×M pseudo-circulant matrices to provide vector-valued filter transfer functions $R_0(z), R_1(z), \ldots R_{N-1}(z)$, respectively;

computing polyphase components $Q_{ij}$ for $0 \leq i \leq N-1$, $0 \leq j \leq M-1$ from the impulse responses;

arranging the M polyphase components $Q_{ij}$ for each matrix-valued filter transfer function into a pseudo-circulant matrix $R_1(z)$;

computing M×M impulse responses $r_1[n]$ for the respective pseudo-circulant matrices $R_1(z)$;

computing M×M submatrices $S(z)$ from the impulse responses $r_1[n]$;

blocking the submatrices $S(z)$ to form said NM×KM polyphase matrix $T(z)$;

generating N delayed sequences by delaying the sequence of input vectors by nL samples where n=0,1, . . . N−1;

decimating the delayed sequences by a factor K to generate respective subsampled sequences that include every $K^{th}$ input vector from the corresponding delayed sequence;

multiplying the input vectors from the K subsampled sequences by the NM×KL polyphase matrix $T(z)$ to generate N sequences of filtered vectors of length M;

expanding the sequences of filtered vectors by a factor N to insert N−1 length M zero vectors between successive filtered vectors and generate respective expanded sequences $S_n$ for n=0,1, . . . N−1;

delaying the expanded sequences $S_n$ where n=0,1, . . . N−1 by nM samples; and summing the expanded sequences together to generate the output sequence as one of the vector convolutional codes.

* * * * *